(12) United States Patent
Yang et al.

(10) Patent No.: US 11,877,476 B2
(45) Date of Patent: Jan. 16, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Shengji Yang, Beijing (CN); Xiaochuan Chen, Beijing (CN); Hui Wang, Beijing (CN); Kuanta Huang, Beijing (CN); Pengcheng Lu, Beijing (CN); Yuncui Zhao, Beijing (CN); Dongmei Xie, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 73 days.

(21) Appl. No.: 16/901,019

(22) Filed: Jun. 15, 2020

(65) Prior Publication Data

US 2021/0091152 A1    Mar. 25, 2021

(30) Foreign Application Priority Data

Sep. 23, 2019 (CN) .......................... 201910901604.6

(51) Int. Cl.
*H10K 59/123* (2023.01)
*H10K 59/122* (2023.01)
(Continued)

(52) U.S. Cl.
CPC ......... *H10K 59/122* (2023.02); *H10K 50/814* (2023.02); *H10K 59/123* (2023.02); *H10K 59/124* (2023.02); *H10K 59/1201* (2023.02)

(58) Field of Classification Search
CPC ............. H01L 27/3248; H01L 27/3258; H01L 27/3276; H01L 51/5212; H01L 51/5271;
(Continued)

(56) References Cited

U.S. PATENT DOCUMENTS

| 2003/0193624 A1* | 10/2003 | Kobayashi | ............ G03F 7/0007 430/326 |
| 2005/0162080 A1* | 7/2005 | Yaegashi | .............. H10K 59/122 313/504 |

(Continued)

FOREIGN PATENT DOCUMENTS

| CN | 103000639 A | 3/2013 |
| CN | 104979375 A | 10/2015 |

(Continued)

OTHER PUBLICATIONS

Office Action dated Jun. 17, 2021 for Chinese Patent Application No. 201910901604.6 and English Translation.

*Primary Examiner* — Bryan R Junge
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a microcavity structure layer and a light emitting structure layer that are stacked, a reflective electrode being disposed in the microcavity structure layer, a groove being disposed on a surface of the microcavity structure layer, the light emitting structure layer including a first electrode disposed in the groove, and the first electrode being connected to the reflective electrode.

14 Claims, 8 Drawing Sheets

(51) Int. Cl.
*H10K 50/814* (2023.01)
*H10K 59/124* (2023.01)
*H10K 59/12* (2023.01)

(58) Field of Classification Search
CPC ............... H10K 59/123; H10K 59/124; H10K 59/8051; H10K 59/80515
See application file for complete search history.

(56) References Cited

U.S. PATENT DOCUMENTS

| | | | |
|---|---|---|---|
| 2007/0257253 A1* | 11/2007 | Im | H01L 27/3258 257/40 |
| 2010/0025664 A1* | 2/2010 | Park | H10K 59/123 438/34 |
| 2010/0200875 A1* | 8/2010 | Takei | H01L 27/3258 257/91 |
| 2013/0301278 A1 | 11/2013 | Choi et al. | |
| 2014/0159022 A1 | 6/2014 | Song et al. | |
| 2014/0239265 A1* | 8/2014 | Kim | H10K 71/18 438/46 |
| 2014/0332781 A1* | 11/2014 | Tokuda | H01L 27/3258 257/40 |
| 2017/0194602 A1 | 7/2017 | Cui et al. | |
| 2018/0062116 A1 | 3/2018 | Park et al. | |
| 2019/0348624 A1* | 11/2019 | Kim | H10K 59/122 |
| 2020/0052053 A1 | 2/2020 | Song et al. | |
| 2021/0020868 A1* | 1/2021 | Ikeda | G06F 3/011 |
| 2021/0167332 A1 | 6/2021 | Wang et al. | |

FOREIGN PATENT DOCUMENTS

| | | | | |
|---|---|---|---|---|
| CN | 107799563 A | | 3/2018 | |
| CN | 108565358 A | * | 9/2018 | ......... H01L 27/3244 |
| CN | 109065590 A | | 12/2018 | |
| CN | 109659349 A | | 4/2019 | |
| CN | 110165084 A | * | 8/2019 | |
| CN | 110246883 A | | 9/2019 | |
| JP | 2007095606 A | * | 4/2007 | |
| KR | 100685846 B1 | * | 2/2007 | ........... H10K 59/121 |

* cited by examiner

DISPLAY SUBSTRATE AND PREPARATION METHOD THEREOF, AND DISPLAY APPARATUS

CROSS-REFERENCE TO RELATED APPLICATION

This application claims the priority of Chinese Patent Application No. 201910901604.6 filed to the CNIPA on Sep. 23, 2019, the content of which is hereby incorporated by reference.

TECHNICAL FIELD

The present disclosure relates to, but is not limited to, the field of display technology, and particularly relates to an organic light emitting display substrate and a preparation method thereof, and a display apparatus.

BACKGROUND

Microdisplays have wide market applicability, and are particularly suitable for use in helmet-mounted displays, stereoscopic display mirrors, glasses type displays, etc. Microdisplays are at intersection of the microelectronic technology and the optoelectronic technology, involve a very wide range of technologies, including optoelectronics, microelectronics, electronic informatics, optics, etc., and pertain to a technical field involving many subjects, such as physics, chemistry, materials science and electronics. An Organic Light Emitting Diode (OLED)-on-silicon microdisplay integrating the OLED technology and the Complementary Metal Oxide Semiconductor (CMOS) technology is a cross-integrated product of optoelectronic industry and microelectronic industry, which can not only promote the development of new generation microdisplay, but also promote the research and development of organic electronics on silicon and even molecular electronics on silicon.

Compared with Digital Micromirror Devices (DMD) and Liquid Crystal on Silicon (LCOS) microdisplays, OLED-on-silicon microdisplays have excellent display characteristics, including high brightness, rich colors, low driving voltages, fast response, low power consumption, etc., and have excellent user experience. In addition, the OLED is an all-solid-state device with a high shock resistance and a wide operating temperature range (from −40° C. to 85° C.). Further, the OLED is a self-luminous device and does not need a backlight, and has a large viewing angle range and a small thickness, which is beneficial to the reduction in system volume and is especially suitable for a near-eye display system.

SUMMARY

The following is a summary of the subject matter described in detail herein. This summary is not intended to limit the scope of protection of the claims.

A display substrate, including a microcavity structure layer and a light emitting structure layer that are stacked, a reflective electrode being disposed in the microcavity structure layer, a groove being disposed on a surface of the microcavity structure layer, the light emitting structure layer including a first electrode disposed in the groove, and the first electrode being connected to the reflective electrode.

In an example embodiment, the display substrate further includes: a driving circuit layer disposed on a silicon-based substrate, the driving circuit layer including a driving transistor, and the driving circuit layer being provided with a first via exposing a drain electrode of the driving transistor.

In an example embodiment, the microcavity structure layer includes: a connection electrode disposed on the driving circuit layer, the connection electrode being connected to the drain electrode of the driving transistor through the first via; a first insulating layer covering the connection electrode, the first insulating layer being provided with a second via exposing the connection electrode; a reflective electrode disposed on the first insulating layer, the reflective electrode being connected to the connection electrode through the second via; and a second insulating layer covering the reflective electrode, the second insulating layer being provided, on a surface away from the silicon-based substrate, with a groove in which a third via exposing the reflective electrode is provided.

In an example embodiment, the first electrode is disposed in the groove of the second insulating layer and is connected to the reflective electrode through the third via.

In an example embodiment, the light emitting structure layer further includes: a light emitting layer disposed on the first electrode and emitting white light, and a second electrode disposed on the light emitting layer.

In an example embodiment, a depth of the groove is 200 angstroms to 600 angstroms.

In an example embodiment, a width of the groove is 1.1 to 1.3 times the width of the reflective electrode.

In an example embodiment, an orthographic projection of the groove on the silicon-based substrate includes an orthographic projection of the first electrode on the silicon-based substrate.

In an example embodiment, a height difference between a surface of the second insulating layer between first electrodes, and a surface of the first electrode is less than 400 angstroms.

In an example embodiment, the surface of the second insulating layer between the first electrodes is flush with the surface of the first electrode.

The present disclosure further provides a display apparatus, including any one or more of the aforementioned display substrates.

A method for preparing a display substrate, including: forming a microcavity structure layer, a reflective electrode being formed in the microcavity structure layer, and a groove being formed on a surface of the microcavity structure layer; and forming a light emitting structure layer on the microcavity structure layer, a first electrode of the light emitting structure layer being formed in the groove and being connected to the reflective electrode.

In an example embodiment, before forming a microcavity structure layer, the preparation method further includes: forming a driving circuit layer on a silicon-based substrate, the driving circuit layer including a driving transistor, and a first via exposing a drain electrode of the driving transistor being formed on the driving circuit layer.

In an example embodiment, the forming a microcavity structure layer includes: forming a connection electrode on the driving circuit layer, the connection electrode being connected to the drain electrode of the driving transistor through the first via; forming a first insulating layer covering the connection electrode, a second via exposing the connection electrode being formed on the first insulating layer; forming a reflective electrode on the first insulating layer, the reflective electrode being connected to the connection electrode through the second via; and forming a second insulating layer covering the reflective electrode, a groove being formed on a surface of the second insulating layer away from the silicon-based substrate, and a third via exposing the reflective electrode being formed in the groove.

In an example embodiment, the forming a light emitting structure layer on the microcavity structure layer includes: forming a first electrode in the groove of the second insulating layer, the first electrode being connected to the reflective electrode through the third via; forming a light emitting layer emitting white light on the first electrode; and forming a second electrode on the light emitting layer.

In an example embodiment, a depth of the groove is 200 angstroms to 600 angstroms.

In an example embodiment, a width of the groove is 1.1 to 1.3 times the width of the reflective electrode.

In an example embodiment, an orthographic projection of the groove on the silicon-based substrate includes an orthographic projection of the first electrode on the silicon-based substrate.

In an example embodiment, a height difference between a surface of the second insulating layer between first electrodes, and a surface of the first electrode is less than 400 angstroms.

In an example embodiment, the surface of the second insulating layer between the first electrodes is flush with the surface of the first electrode.

Other aspects will become apparent upon reading and understanding the accompanying drawings and the detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure. The shapes and dimensions of the components in the drawings do not reflect real proportions, and are only for the purpose of schematically illustrating the present disclosure.

Figure 1:
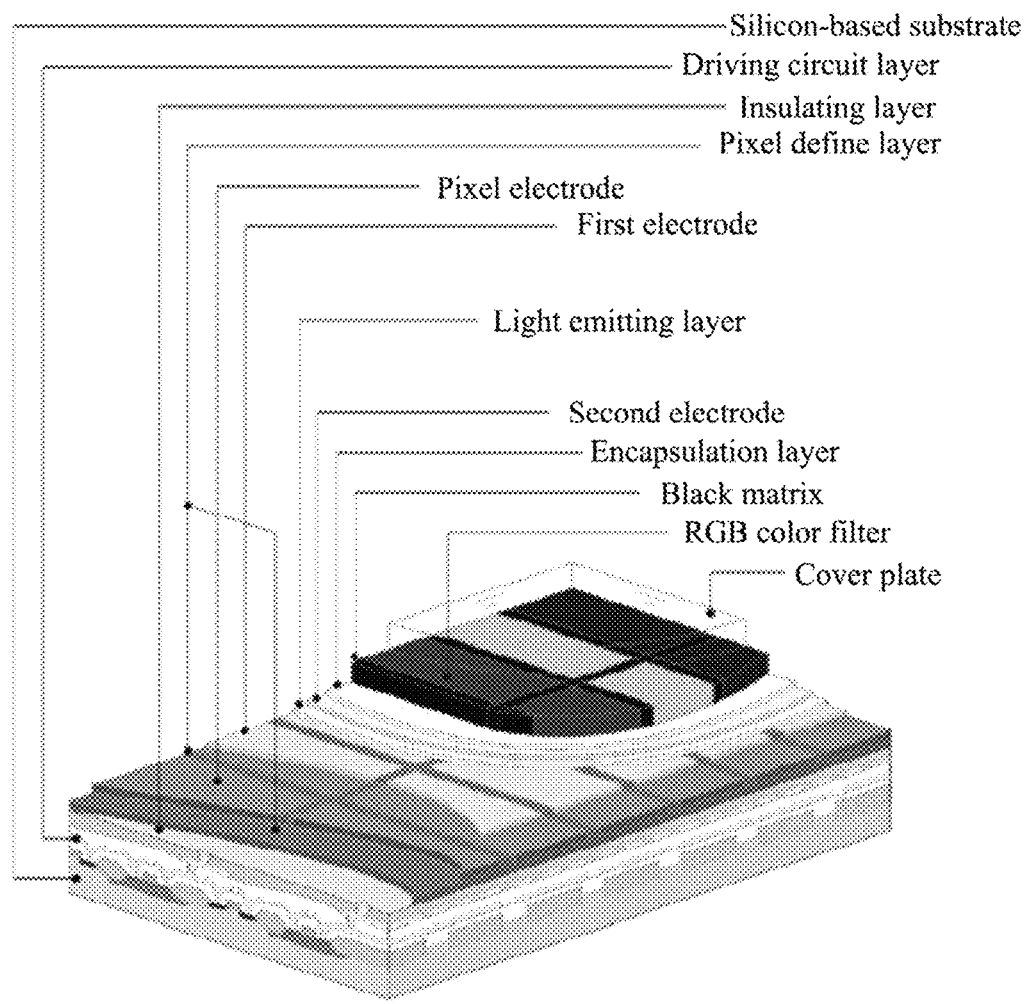
FIG. 1 is a schematic structural view of an OLED-on-silicon microdisplay.

Reference signs in the drawings are explained below.

10—silicon-based substrate; 20—driving circuit layer; 21—driving transistor; 22—drain electrode; 30—microcavity structure layer; 31—connection electrode; 32—first insulating layer; 33—reflective electrode; 34—third insulating layer; 40—light emitting structure layer; 41—first electrode; 42—pixel define layer; 43—light emitting layer; 44—second electrode; 50—color filter layer; 60—lead pad; 61—first connection electrode; 62—second connection electrode; 101—first subpixel; 102—second subpixel; 103—third subpixel; 431—first light emitting sublayer; 432—first charge generating layer; 433—second light emitting sublayer; 434—second charge generating layer; and 435—third light emitting sublayer.

DETAILED DESCRIPTION

The embodiments herein may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments in the present disclosure and the features in the embodiments may be combined with each other arbitrarily if there is no conflict.

FIG. 1 is a schematic structural view of an OLED-on-silicon microdisplay. At present, when used for microdisplay, an OLED realizes full color by means of white light+color filter. As shown in FIG. 1, an OLED-on-silicon microdisplay includes: a silicon-based substrate, a driving circuit layer, a light emitting structure layer, an encapsulation layer, a color filter layer and a cover plate. The silicon-based substrate is also called an IC wafer. The driving circuit layer includes a pixel driving circuit, a pixel electrode, a Gate Driver on Array (GOA), a corresponding IC driving circuit, etc., and is directly prepared on the silicon-based substrate. The light emitting structure layer is disposed on the driving circuit layer and includes a first electrode, a light emitting layer emitting white light, and a second electrode. The encapsulation layer covers the light emitting structure layer. The color filter layer is disposed on the encapsulation layer and includes a black matrix, a red (R) color filter (CF), a green (G) color filter and a blue (B) color filter. The cover plate covers the aforementioned structures. The mode of white light+color filter is employed for the OLED-on-silicon microdisplay to mainly achieve high resolution in Pixels Per Inch, (PPI), so as to meet the requirement of PPI being greater than 2000 when the OLED-on-silicon microdisplay is used as a helmet-mounted display. Although a Fine Metal Mask (FMM) process can also realize full color, this process can only realize an OLED with PPI less than 800 and cannot be applied to the OLED-on-silicon microdisplays with high PPI.

Figure 2:
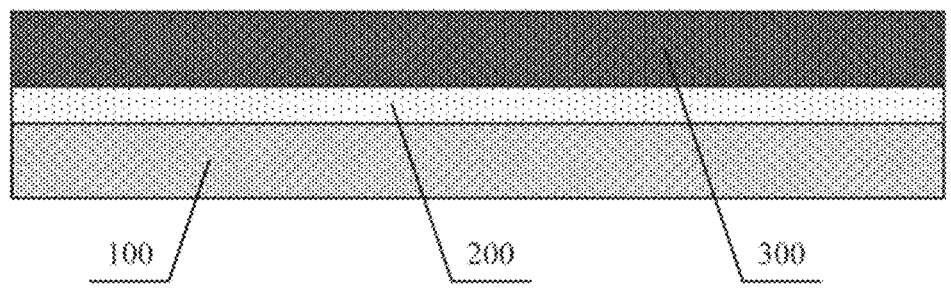
FIGS. 2 to 5 are schematic views illustrating the preparation of an anode and a cathode by using an OLED-on-silicon microdisplay process.
Figure 3:
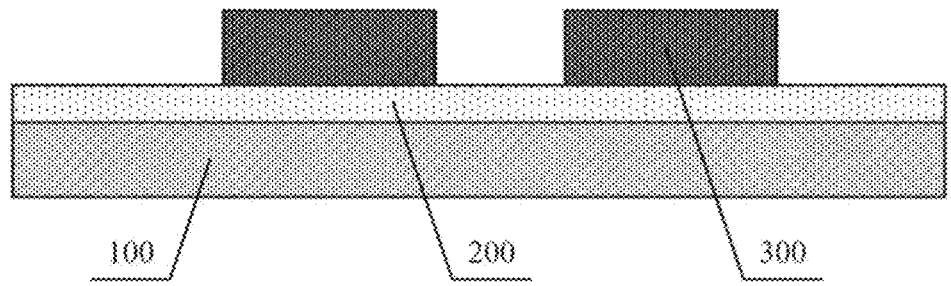
Figure 4:
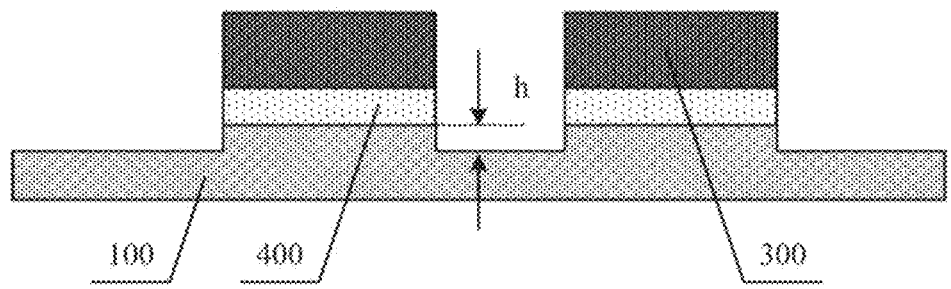
Figure 5:
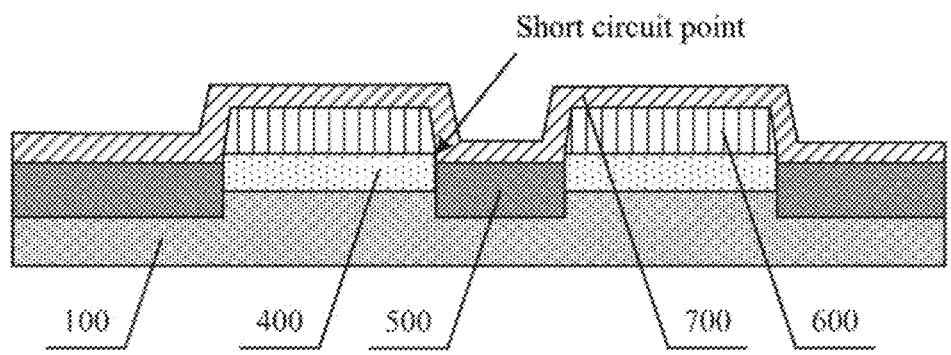

Through research, it is found that there is a problem of short circuit between a cathode and an anode in the preparation process of an OLED-on-silicon microdisplay, which is caused by a relatively large height difference in the preparation process. FIGS. 2 to 5 are schematic views illustrating the preparation of an anode and a cathode by using an OLED-on-silicon microdisplay process. A process for preparing an anode and a cathode includes: depositing a layer of transparent conductive thin film 200 on an insulating layer 100 and coating a layer of photoresist 300 on the transparent conductive thin film 200, as shown in FIG. 2. Subsequently, a photoresist pattern is formed by masking, exposure and development, as shown in FIG. 3. Thereafter, the transparent conductive thin film 200 that is not shielded by the photoresist 300 is etched by a dry etching process to form a pattern of an anode 400. The etching process may cause a loss etch in the insulating layer 100 in the etched region. Typically, the depth h of the loss etch is about 200 angstroms to 300 angstroms, as shown in FIG. 4. In this way, added with the thickness of the transparent conductive thin film itself, the height difference between the anode 400 and the insulating layer 100 will reach about 900 angstroms to 1000 angstroms. Then, a pixel define layer 500 and a light emitting layer 600 are sequentially formed. At the time of forming a cathode 700 finally, since the cathode 700 is very thin, when there is a relatively large height difference between the anode 400 and the insulating layer 100, the pixel define layer 500 cannot completely cover the anode 400, so that the subsequently formed cathode 700 may be lapped at a sharp corner of an edge of the anode 400 at a slope position, resulting in a short circuit between the anode 400 and the cathode 600, as shown in FIG. 5.

The present disclosure provides an organic light emitting display substrate applied for an OLED-on-silicon microdisplay. The display substrate of the present disclosure includes a microcavity structure layer and a light emitting structure layer that are stacked, a reflective electrode being disposed in the microcavity structure layer, the microcavity structure layer being provided on a surface with a groove, the light emitting structure layer including a first electrode disposed in the groove, and the first electrode being connected to the reflective electrode.

Figure 6:
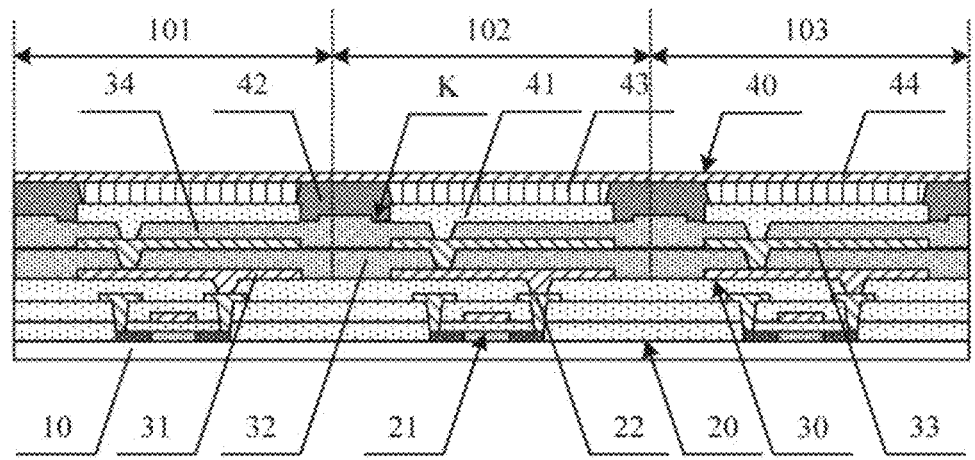
FIG. 6 is a schematic structural view of a display substrate according to the present disclosure.

FIG. 6 is a schematic structural view of a display substrate of the present disclosure, illustrating three subpixels of an organic light emitting display substrate having a top emission structure. The three subpixels include a first subpixel 101, a second subpixel 102, and a third subpixel 103, which are arranged periodically. The first subpixel 101, the second subpixel 102, and the third subpixel 103 are configured to emit light of a first color, light of a second color, and light of a third color, respectively, constituting a pixel unit. As shown in FIG. 6, the display substrate includes: a silicon-based substrate 10, a driving circuit layer 20, a microcavity structure layer 30, and a light emitting structure layer 40.

The driving circuit layer 20 is disposed on the silicon-based substrate 10, the driving circuit layer 20 of each subpixel including a driving transistor 21, and the driving circuit layer 20 of each subpixel being provided with a first via exposing a drain electrode 22 of the driving transistor 21 of the subpixel.

The microcavity structure layer 30 is disposed on the driving circuit layer 20, the microcavity structure layer 30 including: a connection electrode 31 disposed on the driving circuit layer 20 of each subpixel, the connection electrode 31 of each subpixel being connected to the drain electrode 22 of the driving transistor 21 of the subpixel through the first via of the subpixel; a first insulating layer 32 covering the connection electrode 31, the first insulating layer 32 of each subpixel being provided with a second via, the second via of each subpixel exposing the connection electrode 31 of the subpixel; a reflective electrode 33 disposed on the first insulating layer 32 of each subpixel, the reflective electrode 33 of each subpixel being connected to the connection electrode 31 of the subpixel through the second via of the subpixel; and a second insulating layer 34 covering the reflective electrode 33, the second insulating layer 34 of each subpixel being provided with a groove K and a third via, the third via being provided in the groove K, and the third via of each subpixel exposing the reflective electrode 33 of the subpixel.

The light emitting structure layer 40 is disposed on the microcavity structure layer 30, the light emitting structure layer 40 including: a transparent first electrode 41 disposed in the groove K of the second insulating layer 34, the first electrode 41 of each subpixel being connected to the reflective electrode 33 of the subpixel through the third via; a pixel define layer 42 disposed on the second insulating layer 34, the pixel define layer 42 defining an opening region in each subpixel, the opening region exposing the first electrode 41; a light emitting layer 43 disposed in the opening region and emitting white light; and a transflective second electrode 44 disposed on the light emitting layer 43.

In an example embodiment, an orthographic projection of the groove K on the silicon-based substrate 10 includes an orthographic projection of the reflective electrode 33 on the silicon-based substrate 10.

The present disclosure provides a display substrate, in which a groove is formed on a microcavity structure layer and a first electrode of a light emitting structure layer is disposed in the groove, so that the height difference between the first electrode and the microcavity structure layer is effectively controlled, short circuit between a cathode and an anode is avoided in the preparation process of an OLED-on-silicon microdisplay, and the surface flatness and uniformity are ensured for the subsequent evaporation, which improves the product yield and reduces the production cost.

The technical solutions of the present disclosure are described below in detail through the preparation process of the display substrate of the present disclosure. The "patterning process" mentioned in the present disclosure includes the processing such as deposition of a film layer, coating of a photoresist, mask exposure, development, etching, and stripping of photoresist, and is a mature preparation process in related technologies. Deposition may be performed by a known process such as sputtering, evaporation, and chemical vapor deposition, coating may be performed by a known coating process, and etching may be performed by a known method, which is not limited here. In the description of the present disclosure, "thin film" refers to a layer of thin film fabricated by a certain material on a substrate using a depositing or coating process. If the "thin film" does not need a patterning process or a photoetching process throughout the fabrication process, the "thin film" may also be referred to as a "layer". If the "thin film" needs a patterning process or a photoetching process throughout the fabrication process, it is referred to as a "thin film" before the patterning process and as a "layer" after the patterning process. The "layer" that has undergone a patterning process or a photoetching process includes at least one "pattern". "An orthographic projection of A including an orthographic projection of B" means that a boundary of the orthographic projection of B falls within a range of the orthographic projection of A, or a boundary of the orthographic projection of A is equal to a boundary of the orthographic projection of B.

(1) Forming a silicon-based substrate 10. The process of forming the silicon-based substrate 10 may use an IC wafer process.

Figure 7:
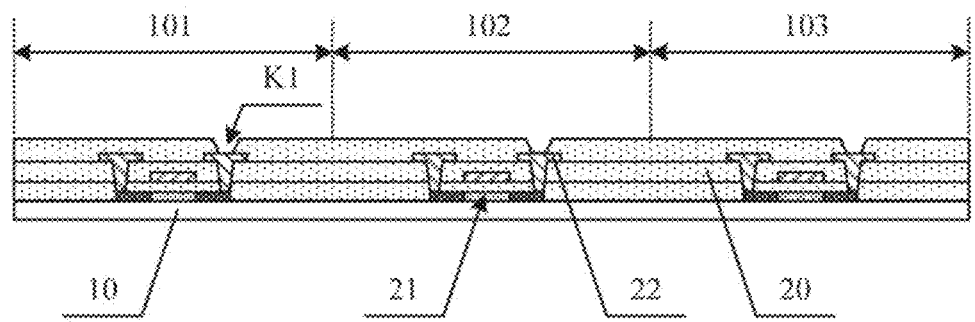
FIG. 7 is a schematic view after the formation of a driving circuit layer pattern according to the present disclosure.

(2) Forming a driving circuit layer 20. The structure of the driving circuit layer 20 of the present disclosure may include a plurality of gate lines and a plurality of data lines. The plurality of gate lines and the plurality of data lines vertically intersect to define a plurality of subpixels arranged in a matrix. Three subpixels are combined into a pixel unit, and each subpixel includes a plurality of Thin Film Transistors (TFT) including a driving transistor 21. In the present disclosure, a pixel unit includes a first subpixel 101, a second subpixel 102, and a third subpixel 103. In some possible implementations, the solution of the present disclosure is also applicable to the case where one pixel unit includes 4 subpixels. In the present disclosure, a pixel driving circuit preparation process may be used to form the driving circuit layer 20. In some possible implementations, the preparation process may include: preparing an active layer on the silicon-based substrate 10 of each subpixel by a patterning process, then forming a first insulating layer covering the active layer, forming a gate line and a gate electrode on the first insulating layer of each subpixel, then forming a second insulating layer covering the gate line and the gate electrode, forming a data line, a source electrode, and a drain electrode on the second insulating layer of each subpixel, and forming a third insulating layer covering the data line, the source electrode, and the drain electrode, the third insulating layer of each subpixel being provided with a first via K1 exposing the drain electrode 22 of the driving transistor 21, as shown in FIG. 7. In an example embodiment, the gate electrode, the active layer, the source electrode, and the drain electrode constitute a thin film transistor, which may be a bottom gate structure or a top gate structure, and is not limited here.

Figure 8:
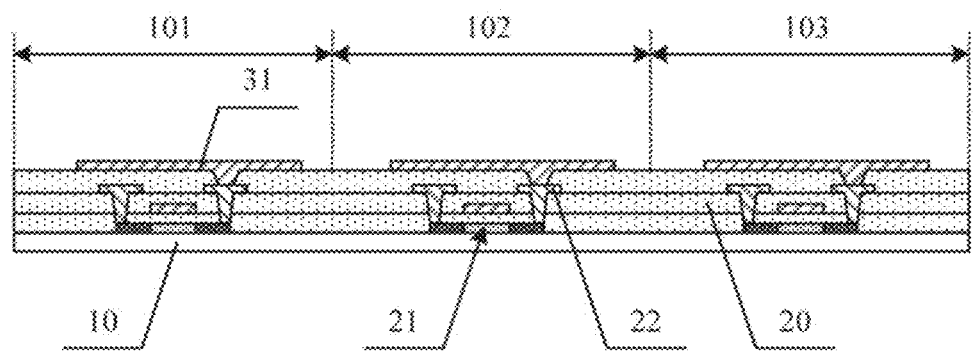
FIG. 8 is a schematic view after the formation of a connection electrode pattern.

(3) Forming a connection electrode pattern. In an example embodiment, the forming a connection electrode pattern may include: depositing a first metal thin film on the substrate on which the aforementioned pattern is formed, and patterning the first metal thin film by a patterning process to form a connection electrode 31 pattern on the driving circuit layer 20 of each subpixel, the connection electrode 31 of each subpixel being connected to the drain electrode 22 of the driving transistor 21 of the subpixel through the first via K1 of the subpixel, as shown in FIG. 8. In an example embodiment, the first metal thin film may be made from a metal material, such as silver (Ag), copper (Cu), aluminum (Al), molybdenum (Mo), or the like, or an alloy material of the above metals. In an example embodiment, the first metal thin film may adopt a Cu/Al/Cu multilayer metal structure.

Figure 9:
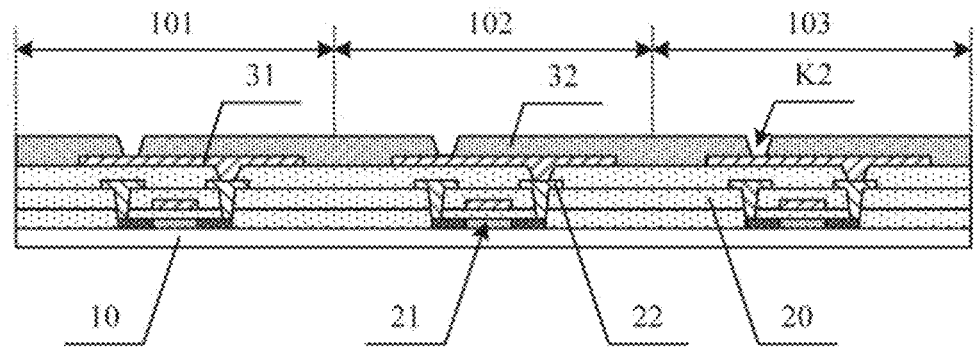
FIG. 9 is a schematic view after the formation of a first insulating layer pattern according to the present disclosure.

(4) Forming a first insulating layer pattern. In an example embodiment, the forming a first insulating layer pattern may include: depositing a first insulating thin film on the substrate on which the aforementioned pattern is formed, and patterning the first insulating thin film by a patterning process to form a first insulating layer 32 pattern covering the connection electrode 31, the first insulating layer 32 of each subpixel being formed with a second via K2, and the second via K2 of each subpixel exposing the connection electrode 31 of the subpixel, as shown in FIG. 9.

Figure 10:
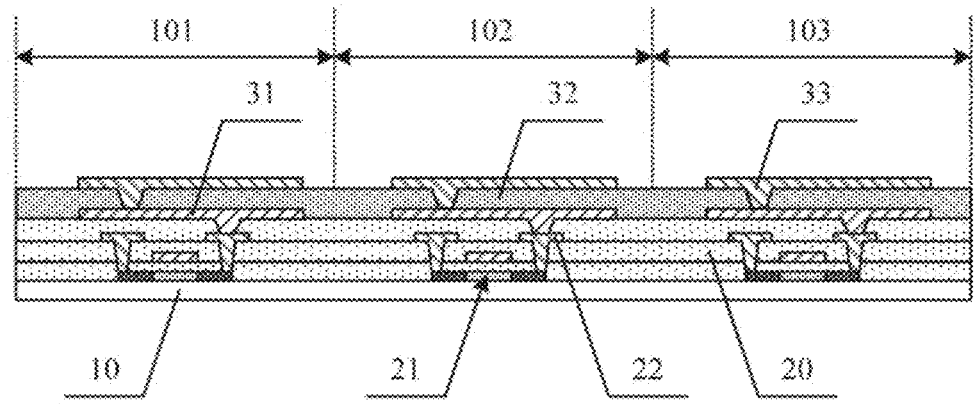
FIG. 10 is a schematic view after the formation of a reflective electrode pattern according to the present disclosure.

(5) Forming a reflective electrode pattern. In an example embodiment, the forming a reflective electrode pattern may include: depositing a second metal thin film on the substrate on which the aforementioned pattern is formed, and patterning the second metal thin film by a patterning process to form a reflective electrode 33 pattern on the first insulating layer 32, the reflective electrode 33 of each subpixel being connected to the connection electrode 31 of the subpixel through the second via K2 of the subpixel, as shown in FIG. 10. In an example embodiment, the second metal thin film may be made from a metal material, such as silver (Ag), copper (Cu), aluminum (Al), molybdenum (Mo), or the like, or an alloy material of the above metals. In an example embodiment, the second metal thin film may be made from aluminum (Al).

Figure 11:
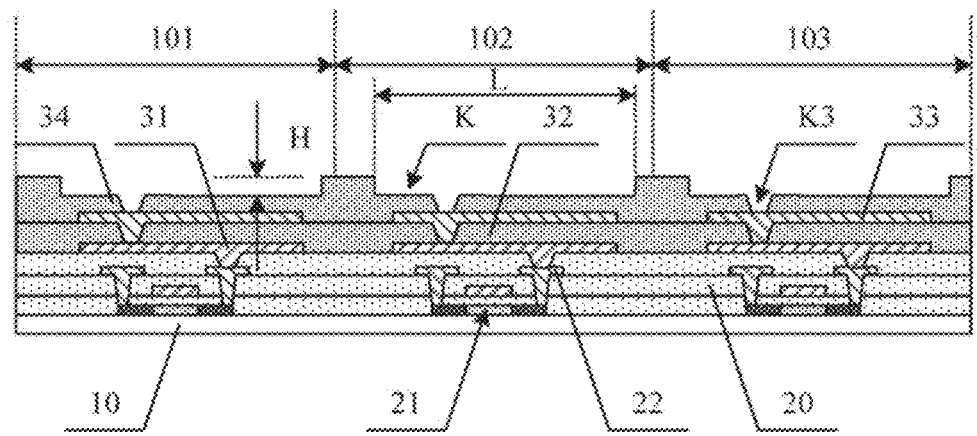
FIG. 11 is a schematic view after the formation of a second insulating layer pattern according to the present disclosure.

(6) Forming a second insulating layer pattern. In an example embodiment, the forming a second insulating layer pattern may include: depositing a second insulating thin film on the substrate on which the aforementioned pattern is formed, and patterning the second insulating thin film by a patterning process to form a second insulating layer 34 pattern covering the reflective electrode 33, the second insulating layer 34 being formed with a groove K and a third via K3, the groove K of each subpixel being provided in a region where the reflective electrode 33 is located, the third via K3 of each subpixel being provided in the groove K, and the third via K3 of each subpixel exposing the reflective electrode 33 of the subpixel, as shown in FIG. 11. In an example embodiment, the groove K being provided in a region where the reflective electrode 33 is located means that an orthographic projection of the groove K on the silicon-based substrate 10 includes an orthographic projection of the reflective electrode 33 on the silicon-based substrate 10. In the subsequent process of forming the first electrode, there will be a certain loss in the thickness of the second insulating layer in a region between adjacent first electrodes, resulting in a relatively large height difference between the first electrode and the second insulating layer. Thus, in order to eliminate or reduce the height difference caused by loss etch in the subsequent process, the present disclosure proposes a solution of providing a groove K on the second insulating layer 34. In the present disclosure, the groove K is provided on the second insulating layer 34, and this is equivalent to performing a heightening process on the second insulating layer 34 in the microcavity structure layer. For the bottom surface of the groove K, it is equivalent to forming a convex structure between the grooves K. The convex structure is located between the subsequently formed first electrodes, i.e., forming the convex structure in the region between the first electrodes in advance prior to the formation of the first electrodes, so as to compensate for the loss etch in the subsequent process of preparing the first electrodes by using the relatively thick insulating layer of the convex structure. In the present disclosure, the depth (i.e., the height of the convex) H of the groove K may be 200 angstroms to 600 angstroms, and the width L of the groove K may be 1.1 to 1.3 times the width of the reflective electrode 33. In some possible implementations, the depth H of the groove K may be 300 angstroms to 500 angstroms, and the width of the groove K may be 1.15 to 1.2 times the width of the reflective electrode 33. In an example embodiment, the first insulating thin film and the second insulating thin film may be made from a silicon oxide ($SiO_x$) or a silicon nitride ($SiN_x$). In some possible implementations, the first insulating thin film and the second insulating thin film may be made from $SiO_2$. In the present disclosure, the connection electrode 31, the first insulating layer 32, the reflective electrode 33, and the second insulating layer 34 collectively serve as the microcavity structure layer.

In the present disclosure, the reflective electrode in the microcavity structure layer of each subpixel is configured to constitute a microcavity structure together with a subsequently formed second electrode. Due to the strong reflection effect of the reflective electrode, the light emitted directly from the light emitting layer and the light reflected by the reflective electrode interfere with each other, which can not only improve the color gamut of the emitted light, but also enhance the brightness of the emitted light. The microcavity effect needs to satisfy $\delta=2j(\lambda/2)=2nd \cos \theta$, where $\delta$ is the microcavity phase difference, j is an integer, $\lambda$ is the wavelength of the emitted light, n is the average refractive index of the medium in the microcavity, d is the length of the microcavity, and $\theta$ is the reflection angle. As can be seen from the above formula of optical path difference of the microcavity, the length d of the microcavity is proportional to the wavelength $\lambda$ of the emitted light, and the length of the microcavity increases with the increase of the wavelength of the emitted light of the corresponding subpixel. Since the wavelength of the light corresponds to the color of the light, it is possible to obtain the length of the microcavity required for the strong microcavity effect of the subpixels with different emitted light colors. In some possible implementations, the length of the microcavity may be set according to actual needs. The length of the microcavity is not limited here, and the length of the microcavity required for the formation of strong microcavity effect with different emitted light colors can be calculated by optical simulation. In some possible implementations, the position of the light emitting layer may be set to satisfy that the phase change of the round-trip optical path between the light emitting layer and the reflective electrode is an integral multiple of $2\pi$ so as to obtain enhanced interference and optimize light emission.

Figure 12:
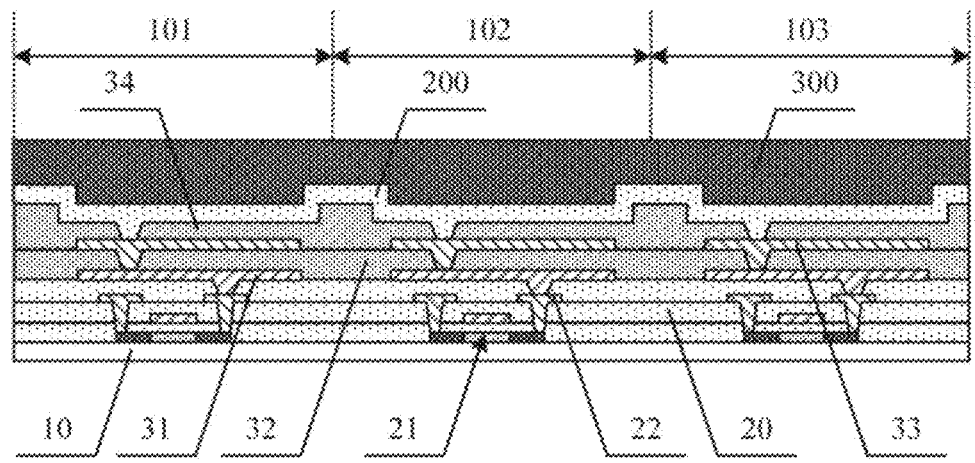
FIG. 12 is a schematic view after the formation of a transparent conductive thin film according to the present disclosure.
Figure 13:
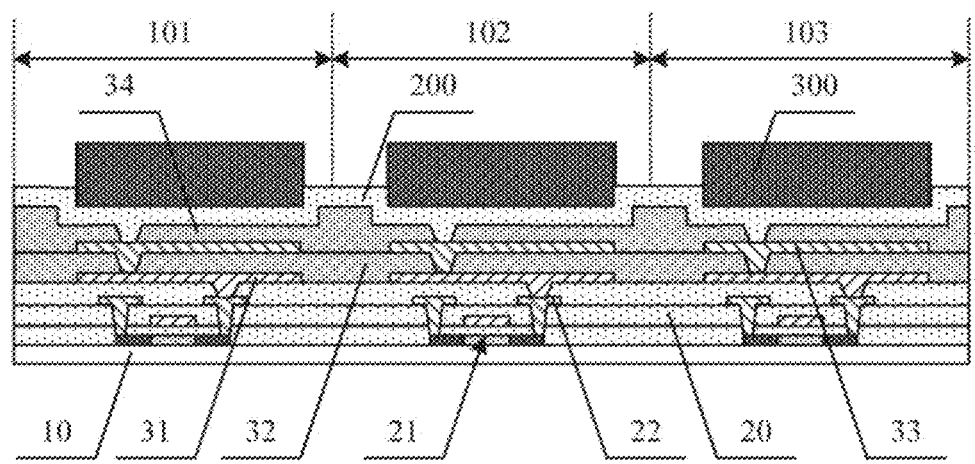
FIG. 13 is a schematic view after the formation of a photoresist pattern according to the present disclosure.
Figure 14:
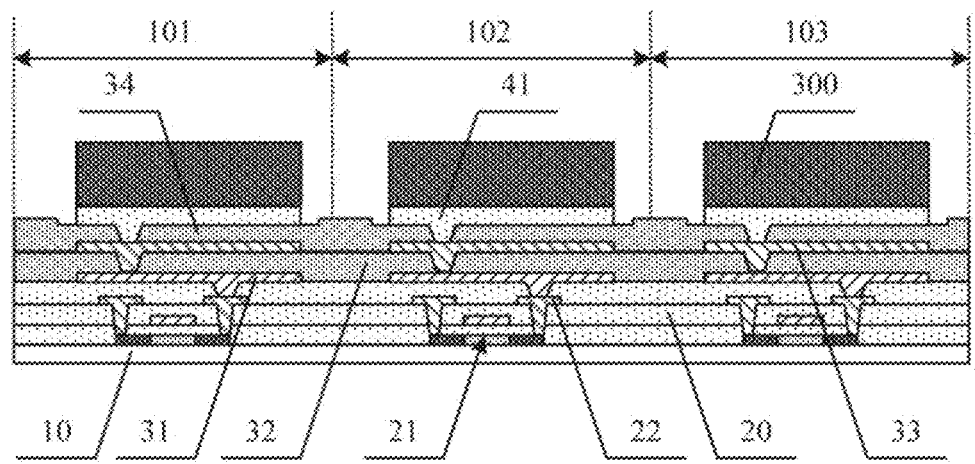
FIG. 14 is a schematic view after the formation of a first electrode pattern according to the present disclosure.
Figure 15:
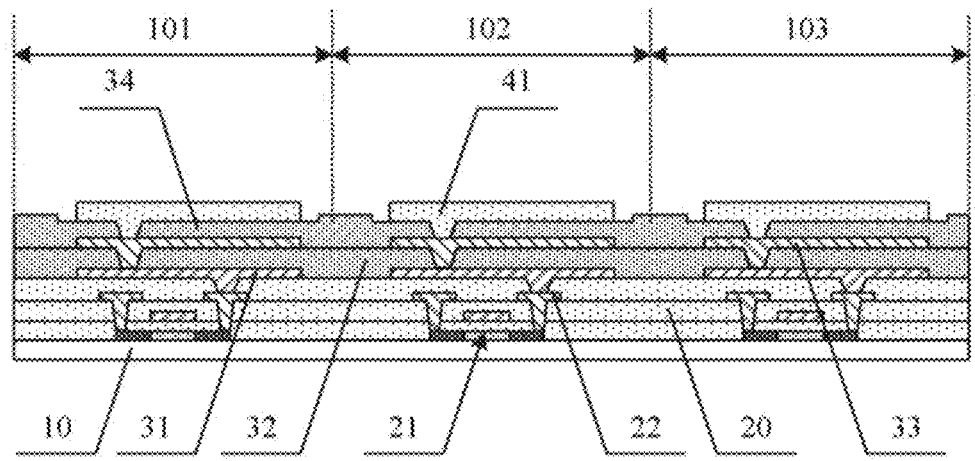
FIG. 15 is a schematic view after photoresist stripping according to the present disclosure.

(7) Forming a first electrode pattern. In an example embodiment, the forming a first electrode pattern may include: depositing a layer of transparent conductive thin film 200 on the substrate on which the aforementioned pattern is formed, and coating a layer of photoresist 300 on the transparent conductive thin film 200, as shown in FIG. 12. Subsequently, a photoresist pattern is formed by masking, exposure and development, as shown in FIG. 13. Thereafter, the transparent conductive thin film 200 that is not shielded by the photoresist 300 is etched by a dry etching process to form a first electrode 41 pattern, as shown in FIG. 14. Finally, the remaining photoresist is stripped off to complete the preparation of a pattern of the first electrode 41, as shown in FIG. 15. In an example embodiment, the first electrode is a transparent anode.

As shown in FIGS. 12 to 15, considering that in the process of etching the first electrode, the second insulating layer 34 in the region (the region between first electrodes) not shielded by the photoresist may be etched away part of the thickness, in the present disclosure, a relatively thick second insulating layer 34 is provided in advance in the region between the first electrodes. The relatively thick second insulating layer 34 partially forms a convex structure, and in the process of etching the first electrode, only a majority of the convex structure or the entire convex structure is etched away. Therefore, this loss etch of the second insulating layer 34 does not increase the height difference between the first electrode 41 and the second insulating layer 34, making it possible to effectively eliminate the occurrence of short circuit between the first electrode and the second electrode caused by a relatively large height difference. The first electrode is formed in the groove. By designing the depth of the groove, it is also possible to further reduce the height difference and control the height difference at 400 angstroms or below. In an example embodiment, it can be designed that after the completion of the etching of the first electrode, the surface of the second insulating layer between the first electrodes is flush with the surface of the first electrode, that is, there is no height difference between the first electrode and the second insulating layer.

Figure 16:
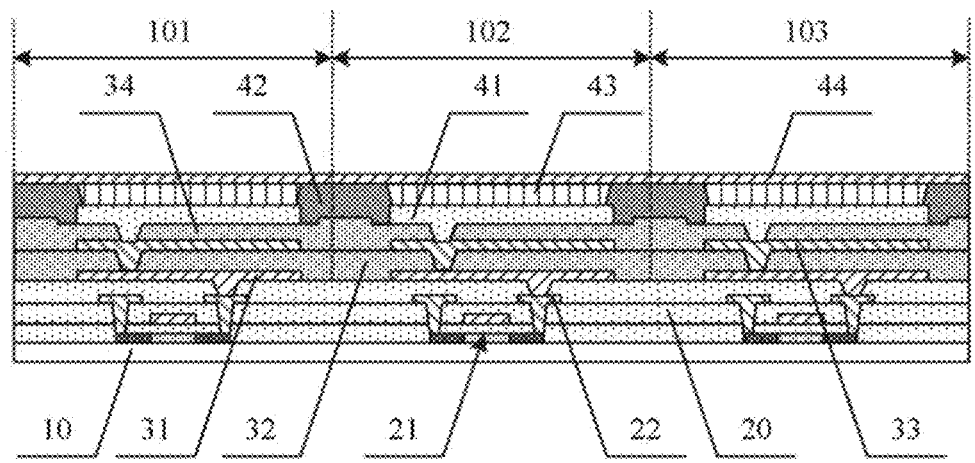
FIG. 16 is a schematic view after the formation of a light emitting layer and a second electrode pattern according to the present disclosure.

(8) Forming a light emitting layer and a second electrode pattern. In an example embodiment, the forming a light emitting layer and a second electrode pattern may include: coating a pixel define thin film on the substrate on which the aforementioned pattern is formed, and forming a pattern of a Pixel Define Layer (PDL) 42 by masking, exposure and development, the PDL 42 defining an opening region at each subpixel, and the opening region exposing the first electrode 41. Subsequently, a light emitting layer 43 is formed in the opening region of each subpixel, and the light emitting layer 43 of each subpixel has the same structure. Finally, a transflective metal thin film is deposited on the substrate on which the aforementioned pattern is formed to form a second electrode 44, as shown in FIG. 16. In some possible implementations, the second electrode is a transflective cathode.

Since a height difference between the first electrode 41 and the second insulating layer 34 is controlled to be relatively small by the preceding processes in the present disclosure, the pixel define layer 42 formed subsequently can completely cover the first electrode 41, avoiding the exposure of the first electrode 41, thereby preventing the second electrode 44 formed subsequently from contacting the first electrode 41, and avoiding the occurrence of short circuit between the first electrode 41 and the second electrode 43. The relatively small height difference between the first electrode 41 and the second insulating layer 34 enables the display substrate to have better surface flatness, which ensures surface flatness and uniformity for the subsequent evaporation to enable the achievement of optimal effect of evaporation, and improves the display quality.

Figure 17:
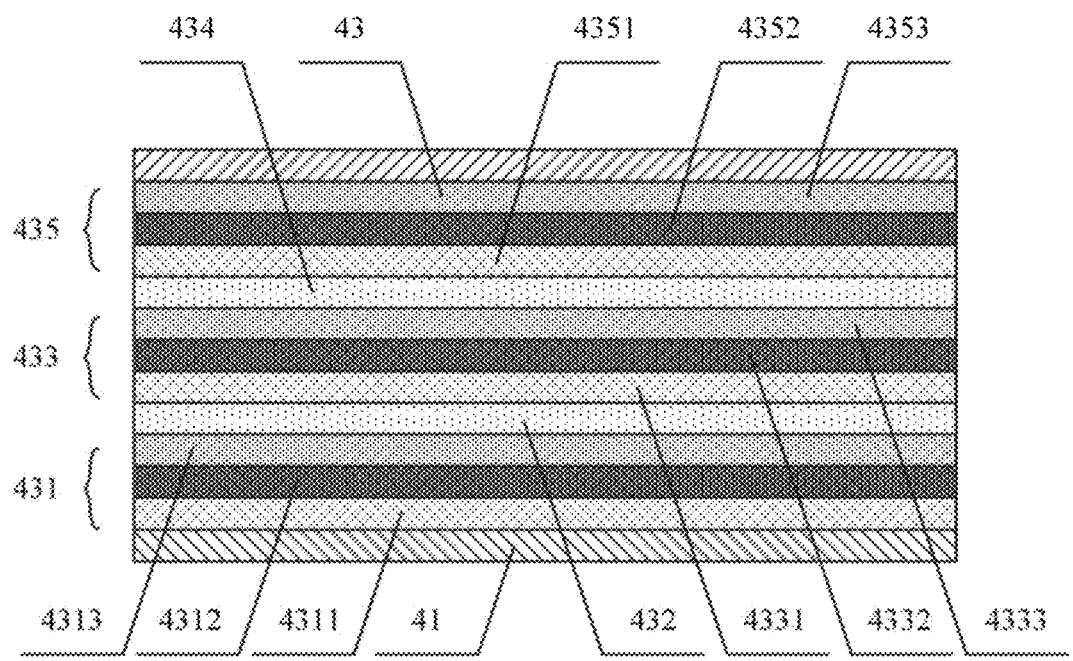
FIG. 17 is a schematic structural view of a light emitting layer according to the present disclosure.

FIG. 17 is a schematic structural view of a light emitting layer of the present disclosure. As shown in FIG. 17, in an example embodiment, the light emitting layer may include a first light emitting sublayer 431, a first charge generating layer 432, a second light emitting sublayer 433, a second charge generating layer 434, and a third light emitting sublayer 435 that are sequentially stacked between the first electrode 41 and the second electrode 44. In an example embodiment, the first light emitting sublayer 431 is configured to emit light of a first color, and may include a first Hole Transport Layer (HTL) 4311, a first light Emitting Material Layer (EML) 4312 and a first Electron Transport Layer (ETL) 4313 stacked in this order. The second light emitting sublayer 433 is configured to emit light of a second color, and may include a second hole transport layer 4331, a second light emitting material layer 4332 and a second electron transport layer 4333 stacked in this order. The third light emitting sublayer 435 is configured to emit light of a third color, and may include a third hole transport layer 4351, a third light emitting material layer 4352 and a third electron transport layer 4353 stacked in this order. The first charge generating layer 432 is provided between the first light emitting sublayer 431 and the second light emitting sublayer 433, and is configured to connect the two light emitting sublayers in series to realize carrier transfer. The second charge generating layer 434 is provided between the second light emitting sublayer 433 and the third light emitting sublayer 435, and is configured to connect the two light emitting sublayers in series to realize carrier transfer. Since the light emitting layer includes a first light emitting material layer emitting light of a first color, a second light emitting material layer emitting light of a second color, and a third light emitting material layer emitting light of a third color, the light eventually emitted by the light emitting layer is mixed light. In some possible implementations, it may be arranged that the first light emitting material layer is a red light material layer emitting red light, the second light emitting material layer is a green light material layer emitting green light, and the third light emitting material layer is a blue light material layer emitting blue light, and therefore, the light emitting layer eventually emits white light.

The light emitting layer shown in FIG. 16 is merely an example structure, and the structure of the light emitting layer may be designed according to actual needs, which is not limited here in the present disclosure. In an example embodiment, in each light emitting sublayer, in order to improve the efficiency of injecting electrons and holes into the light emitting material layer, a Hole Injection Layer (HIL) and an Electron Injection Layer (EIL) may be provided. In an example embodiment, in order to simplify the structure of the light emitting layer, the first electron transport layer 4313, the first charge generating layer 432, and the second hole transport layer 4331 may be cancelled, that is, the second light emitting material layer 4332 is disposed directly on the first light emitting material layer 4312.

Figure 18:
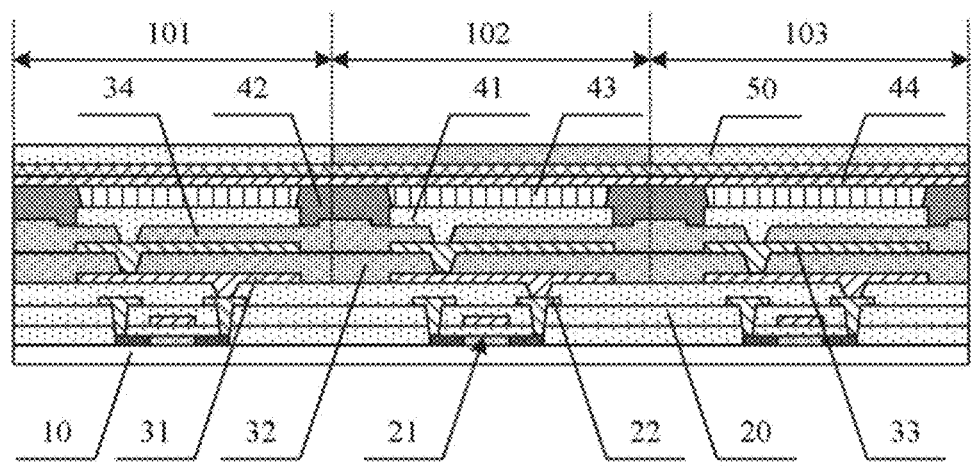
FIG. 18 is a schematic view after the formation of an encapsulation layer and a color filter layer pattern according to the present disclosure.

(9) Forming an encapsulation layer and a color filter layer pattern. In an example embodiment, forming an encapsulation layer and a color filter layer pattern may include: forming an encapsulation layer sealing the light emitting structure layer by depositing an inorganic material and/or coating an organic material on the substrate on which the aforementioned pattern is formed. Subsequently, a pattern of a color filter layer 50 is formed on the encapsulation layer by coating of a color resin thin film, masking, exposing and developing, the color filter layer 50 including a first color filter located in the first subpixel 101, a second color filter located in the second subpixel 102, and a third color filter located in the third subpixel 103, as shown in FIG. 18. In an example embodiment, the first color filter only allows the transmission of the light of the first color, and filters out the light of other colors; the second color filter only allows the transmission of the light of the second color, and filters out the light of other colors; and the third color filter only allows the transmission of the light of the third color, and filters out the light of other colors. In some possible implementations, the forming a color filter layer pattern may include forming a corresponding black matrix and other structures.

Through the above preparation processes, the preparation of the display substrate of the present disclosure is completed. The display substrate prepared by the above process of the present disclosure includes: a driving circuit layer 20, a microcavity structure layer 30, a light emitting structure layer 40, and a color filter layer 50 that are stacked on a silicon-based substrate 10. In an example embodiment, the driving circuit layer 20 is disposed on the silicon-based substrate 10 and includes at least a driving transistor. The microcavity structure layer 30 is disposed on the driving circuit layer 20, and the microcavity structure layer 30 of each subpixel includes a connection electrode and a reflective electrode. The light emitting structure layer 40 is disposed on the microcavity structure layer 30, and includes a transparent first electrode 41, a light emitting layer 43 emitting white light, and a transflective second electrode 44 that are sequentially disposed on the microcavity structure layer 30. The color filter layer 50 is disposed on an encapsulation layer covering the light emitting structure layer 40, the color filter layer 50 of each subpixel includes a color filter, and the color filters of the three subpixels respectively allow the transmission of light of one color.

As shown in FIGS. 7 to 18, the display substrate of the present disclosure includes: a silicon-based substrate 10, a driving circuit layer 20, a microcavity structure layer 30, a light emitting structure layer 40, an encapsulation layer, and a color filter layer 50.

The driving circuit layer 20 is disposed on the silicon-based substrate 10, the driving circuit layer 20 of each subpixel including a driving transistor 21, and the driving circuit layer 20 of each subpixel being provided with a first via K1 exposing a drain electrode 22 of the driving transistor 21 of the subpixel.

The microcavity structure layer 30 is disposed on the driving circuit layer 20, the microcavity structure layer 30 including: a connection electrode 31 disposed on the driving circuit layer 20 of each subpixel, the connection electrode 31 of each subpixel being connected to the drain electrode 22 of the driving transistor 21 of the subpixel through the first via K1 of the subpixel; a first insulating layer 32 covering the connection electrode 31, the first insulating layer 32 of each subpixel being provided with a second via K2, and the second via K2 of each subpixel exposing the connection electrode 31 of the subpixel; a reflective electrode 33 disposed on the first insulating layer 32 of each subpixel, the reflective electrode 33 of each subpixel being connected to the connection electrode 31 of the subpixel through the second via K2 of the subpixel; a second insulating layer 34 covering the reflective electrode 33, the second insulating layer 34 of each subpixel being provided with a groove K and a third via K3, an orthographic projection of the groove K on the silicon-based substrate 10 including an orthographic projection of the reflective electrode 33 on the silicon-based substrate 10, the third via K3 being provided in the groove K, and the third via K3 of each subpixel exposing the reflective electrode 33 of the subpixel.

The light emitting structure layer 40 is disposed on the microcavity structure layer 30, the light emitting structure layer 40 including: a transparent first electrode 41 disposed in the groove K of the second insulating layer 34, the first electrode 41 of each subpixel being connected to the reflective electrode 33 of the subpixel through the third via K3; a pixel define layer 42 disposed on the second insulating layer 34, the pixel define layer 42 defining an opening region in each subpixel, the opening region exposing the first electrode 41; a light emitting layer 43 disposed in the opening region and emitting white light; and a transflective second electrode 44 disposed on the light emitting layer 43.

The encapsulation layer is disposed on the light emitting structure layer 40.

The color filter layer 50 is disposed on the encapsulation layer, including: a first color filter disposed in the first subpixel 101, the first color filter allowing the transmission of only the light of the first color; a second color filter disposed in the second subpixel 102, the second color filter allowing the transmission of only the light of the second color; and a third color filter disposed in the third subpixel 103, the third color filter allowing the transmission of only the light of the third color.

In the present disclosure, by forming a convex structure in the region between the first electrodes in advance using a heightening process in the preparation of the microcavity structure layer, and compensating for the loss etch in the subsequent process of forming the first electrode by using the relatively thick insulating layer of the convex structure, the height difference between the first electrode and the microcavity structure layer is effectively controlled, which avoids the occurrence of short circuit between the first electrode and the second electrode, avoids short circuit between the cathode and the anode in the preparation process of the OLED-on-silicon microdisplay, ensures surface flatness and uniformity for the subsequent evaporation to enable the achievement of optimal effect of evaporation, and improves the display quality.

The preparation of a display substrate in the present disclosure can employ the existing mature process equipment and process flow, and does not need an integrated circuit foundry or an expensive FMM process, which effectively reduces the production cost, and has good process compatibility, high process realizability, and strong practicability.

The present disclosure can meet the requirement of high PPI by employing an OLED+CF structure, and improves the color gamut and brightness of the emitted light by providing a microcavity structure layer including a reflective electrode. A microcavity structure is formed between a reflective electrode for reflecting light and a second electrode for transflecting light in each subpixel, so that the light directly emitted by the light emitting layer and the light reflected by the reflective electrode interfere with each other, which not only can improve the color gamut of the emitted light, but also can enhance the brightness of the emitted light, so that the display substrate of the present disclosure can meet the requirement of high PPI and obtain high color gamut and high brightness, and is suitable for use in the fields such as helmet display, stereoscopic display, and glasses type display.

Figure 19:
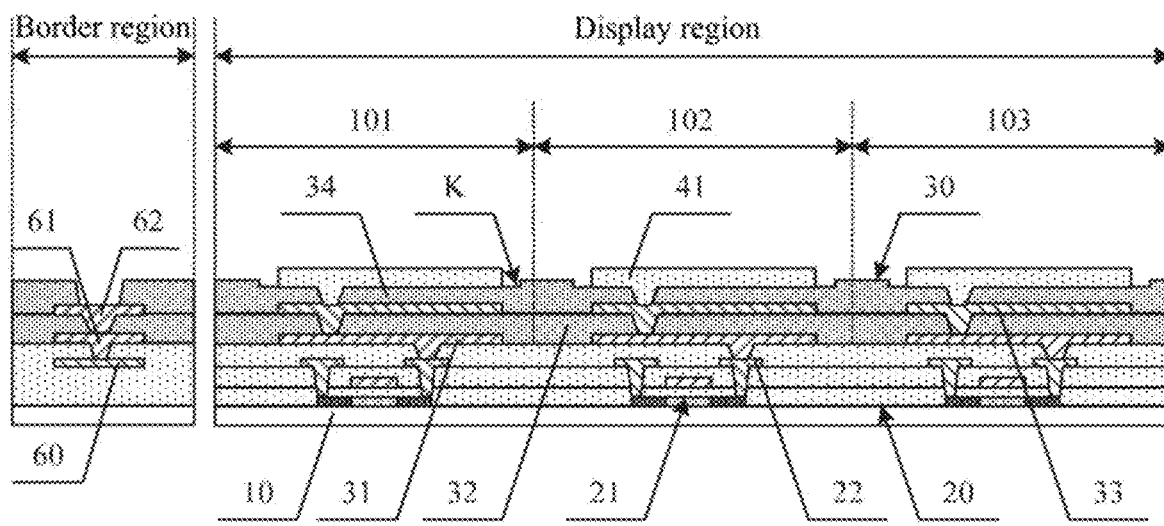
FIG. 19 is a schematic structural view of another display substrate according to the present disclosure.

FIG. 19 is a schematic structural view of another display substrate of the present disclosure. As shown in FIG. 19, the display substrate includes a display region and a border region. The display region has a structure similar to that described in any of the preceding embodiments. The border region includes a lead structure layer in which a lead pad 60 is provided. The lead pad 60 and the drain electrode 22 of the driving transistor 21 in the display region are provided on the same layer, and are formed by a single patterning process. The lead structure layer is provided with a first lead via exposing the lead pad 60, and the first lead via is formed synchronously with the first via in the display region. A first connection electrode 61 is disposed on the lead structure layer and is connected to the lead pad 60 through the first lead via. The first connection electrode 61 and the connection electrode 31 in the display region are provided on the same layer and are formed by a single patterning process. The first insulating layer 32 covers the first connection electrode 61 and is provided with a second lead via exposing the first connection electrode 61. The second lead via is formed synchronously with the second via in the display region. The second connection electrode 62 is disposed on the first insulating layer 32 and is connected to the first connection electrode 61 through the second lead via. The second connection electrode 62 and the reflective electrode 33 in the display region are provided on the same layer, and are formed by a single patterning process. The second insulating layer 34 covers the second connection electrode 62 and is provided with a third lead via exposing the second connection electrode 62. The third lead via is formed synchronously with the groove and the third via in the display region.

The preparation process of the display substrate in this embodiment is similar to the preparation process described in the preceding embodiment, with the structure layer of the border region being formed synchronously with the structure layer of the display region, which will not be repeated here.

The present disclosure further provides a method for preparing an organic light emitting display substrate for an OLED-on-silicon microdisplay. In an example embodiment, the preparation method of the display substrate of the present disclosure includes steps S1 and S2.

In S1, forming a microcavity structure layer, a reflective electrode being formed in the microcavity structure layer, and a groove being formed on a surface of the microcavity structure layer.

In S2, forming a light emitting structure layer on the microcavity structure layer, a first electrode of the light emitting structure layer being formed in the groove and being connected to the reflective electrode.

In an example embodiment, before step S1, the preparation method includes: forming a driving circuit layer on a silicon-based substrate, the driving circuit layer including a driving transistor, and a first via exposing a drain electrode of the driving transistor being formed on the driving circuit layer.

In an example embodiment, step S1 includes: forming a connection electrode on the driving circuit layer, the connection electrode being connected to the drain electrode of the driving transistor through the first via on the driving circuit layer; forming a first insulating layer covering the connection electrode, a second via exposing the connection electrode being formed on the first insulating layer; forming a reflective electrode on the first insulating layer, the reflective electrode being connected to the connection electrode through the second via on the first insulating layer; and forming a second insulating layer covering the reflective electrode, a groove being formed on a surface of the second insulating layer away from the silicon-based substrate, and a third via exposing the reflective electrode being formed in the groove.

In an example embodiment, step S2 includes: forming a first electrode in the groove of the second insulating layer, the first electrode being connected to the reflective electrode through the third via on the second insulating layer; forming a light emitting layer emitting white light on the first electrode; and forming a second electrode on the light emitting layer.

In an example embodiment, a depth of the groove is 200 angstroms to 600 angstroms.

In an example embodiment, an orthographic projection of the groove on the silicon-based substrate includes an orthographic projection of the first electrode on the silicon-based substrate.

In an example embodiment, width of the groove is 1.1 to 1.3 times the width of the first electrode.

In an example embodiment, the preparation method further includes: forming a color filter layer on the light emitting structure layer.

In an example embodiment, a height difference between the surface of the second insulating layer between the first electrodes, and the surface of the first electrode is less than 400 angstroms.

In an example embodiment, the surface of the second insulating layer between the first electrodes is flush with the surface of the first electrode.

The present disclosure provides a method for preparing a display substrate, in which a groove is formed on a microcavity structure layer and a first electrode of a light emitting structure layer is disposed in the groove, so that the height difference between the first electrode and the microcavity structure layer is effectively controlled, short circuit between a cathode and an anode is avoided in the preparation process of an OLED-on-silicon microdisplay, and the surface flatness and uniformity are ensured for the subsequent evaporation, which improves the product yield and reduces the production cost.

The present disclosure further provides a display apparatus, including the aforementioned display substrate. As an OLED-on-silicon microdisplay, the display apparatus may be applied to any one or more of a helmet-mounted display, a stereoscopic display mirror, and a glasses type display.

In the description of the present disclosure, it should be understood that the azimuth or position relationship indicated by the terms "middle", "upper", "lower", "front", "rear", "vertical", "horizontal", "top", "bottom", "inner", "outer" and the like is based on the azimuth or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the present disclosure, it should be noted that, unless otherwise clearly specified or defined, the term "install", "connect" or "link" should be broadly interpreted, for example, it may be fixed connection, detachable connection, or integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

Although the embodiments disclosed in the present disclosure are as described above, the described contents are only the embodiments for facilitating understanding of the present disclosure, which are not intended to limit the present disclosure. Any person skilled in the art to which the present disclosure pertains can make any modifications and variations in the form and details of implementation without departing from the spirit and scope of the present disclosure. Nevertheless, the scope of patent protection of the present application shall still be determined by the scope as defined in the appended claims.

What we claim is:

1. A display substrate, comprising a microcavity structure layer and a light emitting structure layer that are stacked, a reflective electrode being disposed in the microcavity structure layer, a groove being disposed on a surface of the microcavity structure layer, the light emitting structure layer comprising a first electrode disposed in the groove, and the first electrode being connected to the reflective electrode;
    wherein the display substrate further comprises: a driving circuit layer disposed on a silicon-based substrate, the driving circuit layer comprising a driving transistor, and the driving circuit layer being provided with a first via exposing a drain electrode of the driving transistor;
    wherein the microcavity structure layer comprises:
    a connection electrode disposed on the driving circuit layer, the connection electrode being connected to the drain electrode of the driving transistor through the first via;
    a first insulating layer covering the connection electrode, the first insulating layer being provided with a second via exposing the connection electrode;
    a reflective electrode disposed on the first insulating layer, the reflective electrode being connected to the connection electrode through the second via; and
    a second insulating layer covering the reflective electrode, the second insulating layer being provided, on a surface away from the silicon-based substrate, with the groove in which a third via exposing the reflective electrode is provided, wherein the groove is communicated with the reflective electrode through the third via hole and separated from the drain electrode by the third via hole, the third insulating layer, the reflective electrode, the first insulating layer, and the connection electrode, the first electrode is disposed in the groove of the second insulating layer to control a height difference between the first electrode and the second insulating layer, and a width of the groove is greater than a width of the first electrode, and a height of the groove is less than a height of the first electrode.

2. The display substrate according to claim 1, wherein the first electrode is disposed in the groove of the second insulating layer and is connected to the reflective electrode through the third via.

3. The display substrate according to claim 1, wherein the light emitting structure layer further comprises: a light emitting layer disposed on the first electrode and emitting white light, and a second electrode disposed on the light emitting layer.

4. The display substrate according to claim 1, wherein a depth of the groove is 200 angstroms to 600 angstroms.

5. The display substrate according to claim 1, wherein an orthographic projection of the groove on the silicon-based substrate includes an orthographic projection of the first electrode on the silicon-based substrate.

6. The display substrate according to claim 1, wherein a height difference between a surface of the second insulating layer between first electrodes, and a surface of the first electrode is less than 400 angstroms.

7. The display substrate according to claim 6, wherein the surface of the second insulating layer between the first electrodes is flush with the surface of the first electrode.

8. A display apparatus, comprising the display substrate according to claim 1.

9. A method for preparing a display substrate, comprising:
    forming a microcavity structure layer, a reflective electrode being formed in the microcavity structure layer, and a groove being formed on a surface of the microcavity structure layer; and
    forming a light emitting structure layer on the microcavity structure layer, a first electrode of the light emitting structure layer being formed in the groove and being connected to the reflective electrode;
    wherein before the forming a microcavity structure layer, the preparation method further comprises:
    forming a driving circuit layer on a silicon-based substrate, the driving circuit layer comprising a driving transistor, and a first via exposing a drain electrode of the driving transistor being formed on the driving circuit layer;
    wherein the forming a microcavity structure layer comprises:
    forming a connection electrode on the driving circuit layer, the connection electrode being connected to the drain electrode of the driving transistor through the first via; forming a first insulating layer covering the connection electrode, a second via exposing the connection electrode being formed on the first insulating layer;
    forming a reflective electrode on the first insulating layer, the reflective electrode being connected to the connection electrode through the second via; and
    forming a second insulating layer covering the reflective electrode, the groove being formed on a surface of the second insulating layer away from the silicon-based substrate, and a third via exposing the reflective electrode being formed in the groove, wherein the groove is communicated with the reflective electrode through the third via and separated from the drain electrode by the third via hole, the third insulating layer, the reflective electrode, the first insulating layer, and the connection electrode, the first electrode is disposed in the groove of the second insulating layer to control a height difference between the first electrode and the second insulating layer, a width of the groove is greater than a width of the first electrode, and a height of the groove is less than a height of the first electrode.

10. The preparation method according to claim 9, wherein the forming a light emitting structure layer on the microcavity structure layer comprises:
forming the first electrode in the groove of the second insulating layer, the first electrode being connected to the reflective electrode through the third via;
forming a light emitting layer emitting white light on the first electrode; and
forming a second electrode on the light emitting layer.

11. The preparation method according to claim 9, wherein a depth of the groove is 200 angstroms to 600 angstroms.

12. The preparation method according to claim 9, wherein an orthographic projection of the groove on the silicon-based substrate includes an orthographic projection of the first electrode on the silicon-based substrate.

13. The preparation method according to claim 9, wherein a height difference between a surface of the second insulating layer between first electrodes, and a surface of the first electrode is less than 400 angstroms.

14. The preparation method according to claim 13, wherein the surface of the second insulating layer between the first electrodes is flush with the surface of the first electrode.

* * * * *